United States Patent
Saliba

(10) Patent No.: US 11,626,890 B2
(45) Date of Patent: *Apr. 11, 2023

(54) DYNAMICALLY VARIABLE ERROR CORRECTING CODE (ECC) SYSTEM WITH HYBRID RATELESS REED-SOLOMON ECCS

(71) Applicant: Quantum Corporation, San Jose, CA (US)

(72) Inventor: George Saliba, Boulder, CO (US)

(73) Assignee: Quantum Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/850,398

(22) Filed: Jun. 27, 2022

(65) Prior Publication Data

US 2022/0329263 A1 Oct. 13, 2022

Related U.S. Application Data

(63) Continuation of application No. 17/154,739, filed on Jan. 21, 2021, now Pat. No. 11,398,836, which is a
(Continued)

(51) Int. Cl.
*G11C 29/00* (2006.01)
*H03M 13/15* (2006.01)
*H03M 13/09* (2006.01)
*H03M 13/00* (2006.01)
*H03M 13/29* (2006.01)
*H03M 13/37* (2006.01)

(52) U.S. Cl.
CPC ......... *H03M 13/154* (2013.01); *H03M 13/09* (2013.01); *H03M 13/1515* (2013.01); *H03M 13/2906* (2013.01); *H03M 13/3761* (2013.01); *H03M 13/616* (2013.01)

(58) Field of Classification Search
CPC ........... H03M 13/154; H03M 13/1515; H03M 13/09; H03M 13/616
See application file for complete search history.

(56) References Cited

U.S. PATENT DOCUMENTS 5,541,938 A 7/1996 Di Zenzo et al.
6,307,487 B1 10/2001 Luby
(Continued)

*Primary Examiner* — Samir W Rizk
(74) *Attorney, Agent, or Firm* — Roeder & Broder LLP; James P. Broder

(57) ABSTRACT

Example apparatus and methods control whether and when hybrid rateless Reed Solomon (RS) error correcting codes (ECC) for a message are produced, stored, and distributed. The control may be based on a property (e.g., reliability, error state, speed) of a message recipient. Example apparatus and methods may also control whether and when fountain codes for the message are produced, stored, and distributed. Once again, the control may be based on a property of a message or ECC recipient. Both the hybrid rateless RS ECC and the fountain codes may be produced from data stored in a modified RS matrix. The modified RS matrix may store row-centric error detection codes (EDC) instead of conventional cyclic redundancy check (CRC) characters. The modified RS matrix may store column-centric ECC that may be produced serially. Different types or numbers of ECC may be produced, stored, and provided for different messages stored at different recipients.

20 Claims, 11 Drawing Sheets

Related U.S. Application Data continuation of application No. 14/722,809, filed on May 27, 2015, now Pat. No. 10,903,858.

(56) References Cited

U.S. PATENT DOCUMENTS

| | | |
|---|---|---|
| 6,856,263 B2 | 2/2005 | Shokrollahi et al. |
| 7,068,729 B2 | 6/2006 | Shokrollahi et al. |
| 7,971,129 B2 | 6/2011 | Watson et al. |
| 10,903,858 B2 * | 1/2021 | Saliba ............... H03M 13/2906 |
| 11,398,836 B2 * | 7/2022 | Saliba ............... H03M 13/3761 |
| 2005/0257106 A1 | 11/2005 | Luby et al. |
| 2006/0036930 A1 | 2/2006 | Luby et al. |
| 2007/0300127 A1 | 12/2007 | Watson |
| 2011/0145678 A1 | 6/2011 | Agarwal et al. |
| 2013/0077719 A1 | 3/2013 | Oren et al. |

* cited by examiner

Prior Art Figure 1

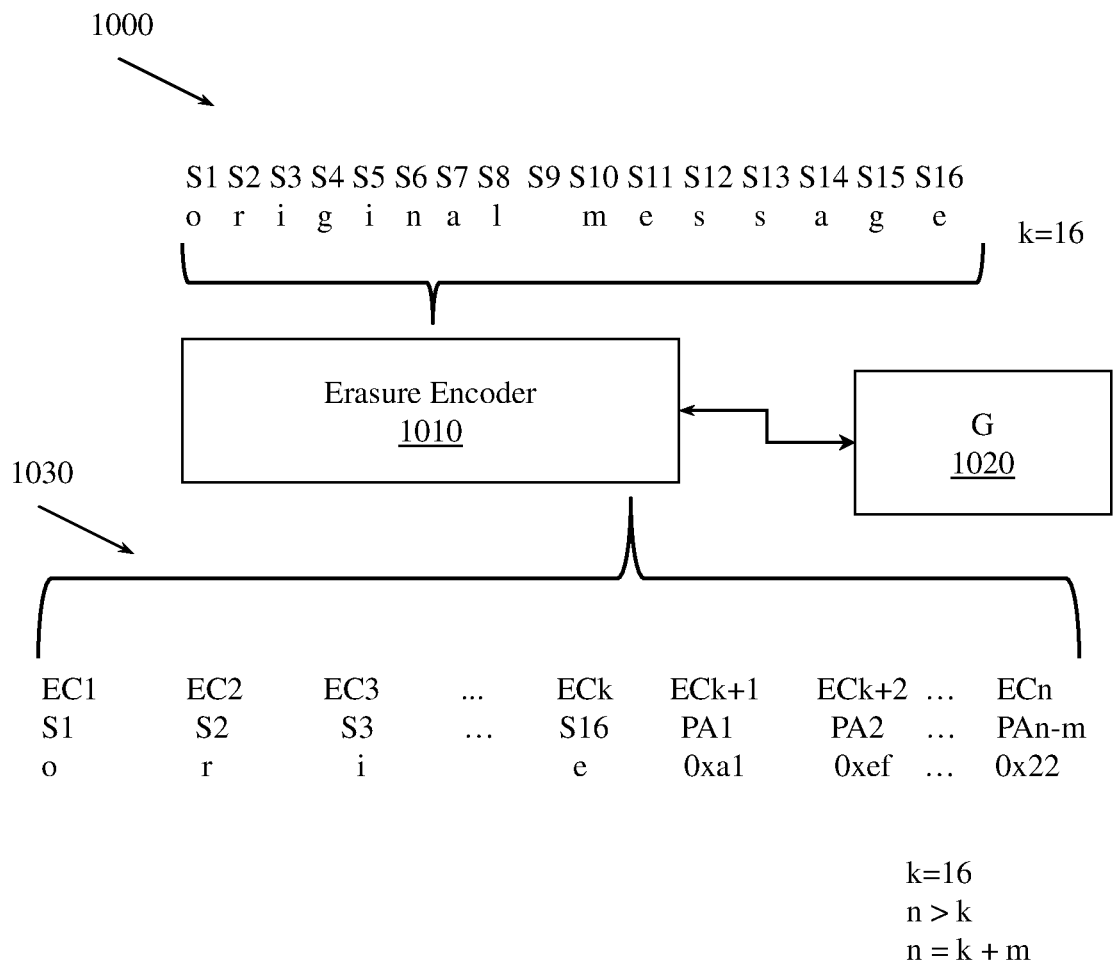
Prior Art Figure 10

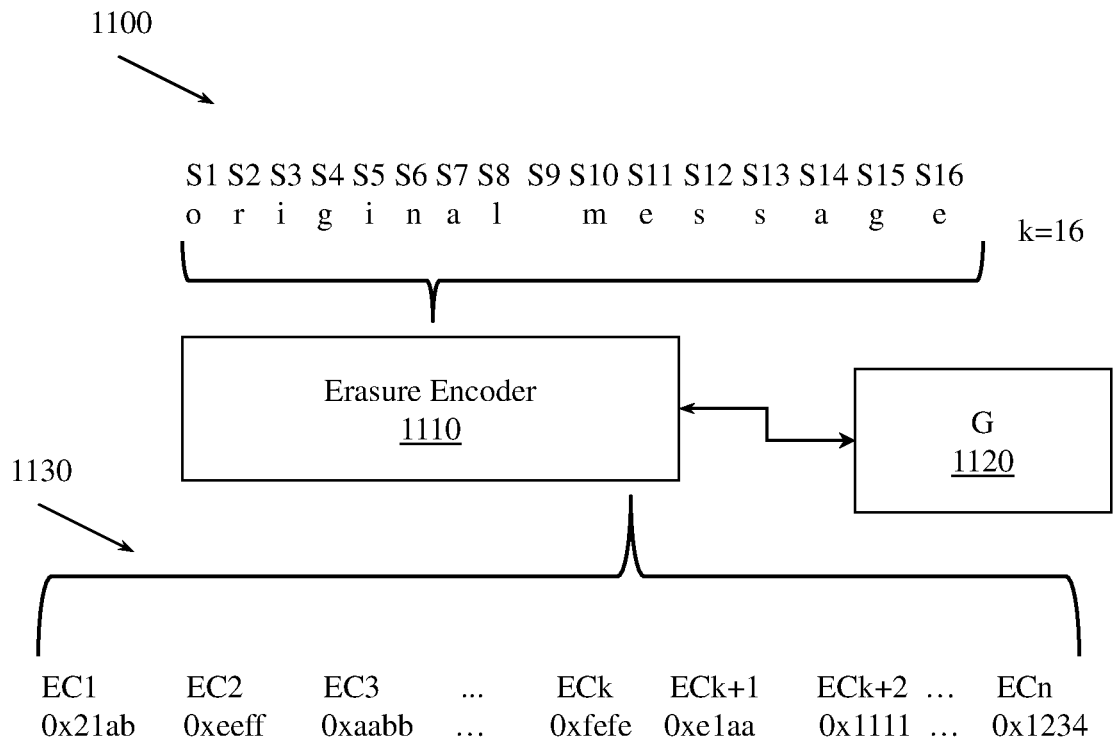
Prior Art Figure 11

DYNAMICALLY VARIABLE ERROR CORRECTING CODE (ECC) SYSTEM WITH HYBRID RATELESS REED-SOLOMON ECCS

RELATED APPLICATIONS

This application is a continuation application and claims priority from U.S. application Ser. No. 17/154,739, filed Jan. 21, 2021, and entitled "DYNAMICALLY VARIABLE ERROR CORRECTING CODE (ECC) SYSTEM WITH HYBRID RATELESS REED-SOLOMON ECCs", which claims priority from U.S. application Ser. No. 14/722,809, filed May 27, 2015 and entitled "DYNAMICALLY VARIABLE ERROR CORRECTING CODE (ECC) SYSTEM WITH HYBRID RATELESS REED-SOLOMON ECCs." As far as permitted, the contents of U.S. application Ser. Nos. 17/154,739 and 14/722,809 are incorporated herein by reference.

BACKGROUND

Users want to store and communicate electronic data. Data that is stored or communicated may be error-free or may experience errors. Therefore, users have developed different techniques to protect data. For example, data may be protected against storage media failures or other loss by storing extra copies in additional locations or by storing additional redundant information from which data may be reconstructed. One type of redundancy-based protection involves using erasure coding. Erasure coding creates additional redundant data to produce code symbols that protect against 'erasures' where data portions that are lost can be reconstructed from the surviving data. Typically, erasure codes or other error correcting codes are generated and transmitted at the same time that the data is transmitted. Adding redundancy in this way introduces computing overhead to produce the codes and also introduces overhead for additional storage capacity or transmission bandwidth, which in turn adds cost. The overhead added by erasure code processing tends to increase as the protection provided increases.

Different approaches for storing redundant copies of items have been employed. Erasure codes are one such approach. An erasure code (EC) is a forward error correction (FEC) code for erasure channels. The FEC facilitates transforming a message of k symbols into a longer message with n symbols so that the original message can be recovered from a subset of the n symbols, k and n being integers, n>k. The symbols may be individual items (e.g., characters, bytes) or groups of items. The original message may be, for example, a file. The fraction r=k/n is called the code rate, and the fraction k'/k, where k' denotes the number of symbols required for recovery, is called the reception efficiency or coding overhead. Optimal erasure codes have the property that any k out of the n code word symbols are sufficient to recover the original message (e.g., coding overhead of unity). Optimal codes may require extensive memory usage, CPU time, or other resources when n is large. Erasure coding approaches may seek to create the greatest level of protection with the least amount of overhead via optimal or near optimal coding.

Different types of erasure codes have different properties including efficiencies and tradeoffs in terms of complexity, resources, and performance. Reed Solomon (RS) codes and fountain codes are two types of erasure codes. RS codes and other error correcting codes (ECC) have the ability to locate an error in a message and the ability to help reproduce or reconstruct a message that has an error. In general, if n symbols are available in the ECC for a message, then n/2 symbols errors may be located and corrected. Half of the symbols may be used to locate the n/2 errors and the other half of the symbols may be used to correct the n/2 errors. If the locations of the errors are known, then n symbols errors may be corrected.

There are many different varieties of RS codes. RS codes are maximum distance separable (MDS) codes. An RS code may be referred to as a rated code because RS codes have the property that a fixed number of additional codes are generated from a given set of source symbols. The additional codes may be generated using a fixed size matrix. RS codes are efficient with respect to the number of additional codes that are needed to reconstruct a message but may be time consuming to create and decode. Typically, RS codes are generated and transmitted at the same time that data protected by the RS codes is transmitted.

A fountain code (FC) has the property that a potentially limitless sequence of code symbols may be generated from a given set of source symbols in a manner that supports ideally recovering the original source symbols from any subset of the code symbols having a size equal to or larger than the number of source symbols. FCs may be referred to as rateless codes whereas an RS code may be referred to as a rated code. An FC may not be as efficient as an RS code with respect to the number of additional codes that are needed to reconstruct a message. However, an FC may be faster to compute and decode.

A fountain code may be optimal if the original k source symbols can be recovered from any k encoding symbols, k being an integer. FCs may have efficient encoding and decoding algorithms that support recovering the original k source symbols from any k' of the encoding symbols with high probability, where k' is just slightly larger than k (e.g., an overhead close to unity).

An EC system may be described using an A/B notation, where B describes the total number of encoded symbols that can be produced for an input message and A describes the minimum number of the B encoded symbols that are required to recreate the message for which the encoded symbols were produced. By way of illustration, in a 10 of 16 configuration, or EC 10/16, sixteen encoded symbols could be produced. The 16 encoded symbols could be spread across a number of drives, nodes, or geographic locations. The 16 encoded symbols could even be spread across 16 different locations. In the EC 10/16 example, the original message could be reconstructed from 10 verified encoded symbols.

Prior Art FIG. 1 illustrates a conventional system where an input message 100 is presented to an encoder 110 that produces ECC symbols 120. The encoder 110 may employ a matrix 130 to produce the ECC symbols 120. When a systematic EC is employed, some of the ECC symbols 120 may be plaintext symbols that appeared in message 100.

Conventionally, whether an RS code, an FC code, or other type of EC code is employed, a fixed number of ECC symbols are produced and then distributed using a fixed pre-determined approach. While this conventional approach may provide satisfactory results for some scenarios, other scenarios may benefit from other approaches. The conventional approach may include generating and transmitting the ECC symbols at the same time as the data protected by the ECC symbols.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Prior Art

Prior Art FIG. 10 illustrates an example set of systematic erasure codes.

Prior Art FIG. 11 illustrates an example set of non-systematic erasure codes.

DETAILED DESCRIPTION

Figure 1:
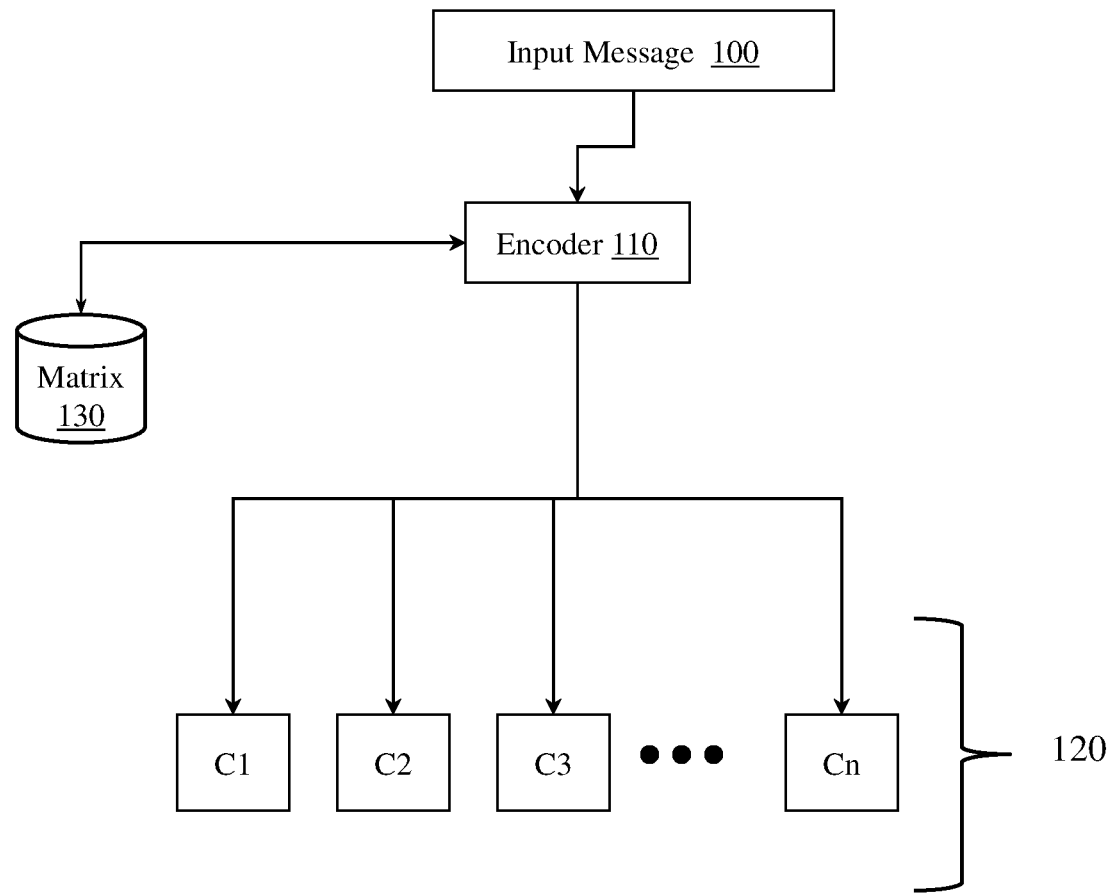
FIG. 1 illustrates encoding an input message into codes.

Conventionally, whether an RS code, an FC code, or other type of EC code is employed, a fixed number of error detecting or correcting symbols are produced and then distributed using a fixed approach. This conventional approach is based on the assumption that eventually the data is going to need to be corrected and thus it is worthwhile to produce, distribute, and store the ECCs. However, the assumption that the data will need to be corrected may not be the best assumption in some scenarios. Additionally, when data is read in a conventional system, a fixed amount of error detecting or correcting symbols are read when data is acquired from nodes to which the data has been distributed. Example apparatus and methods are based on a different assumption, that most of the time the data is not going to experience an error and thus will not need to be corrected. Conventional approaches may also have been based on an assumption that when a data storage device (e.g., disk) failed, it failed completely. Thus, disk based systems were often paired with fixed redundancy policies with a fixed comprehensive amount of ECC that was generated and distributed at the time the data was distributed. Once again, this assumption may not be the best assumption in some scenarios. For example, in cloud storage, a device may not fail completely, but may "fail" intermittently by not being available. Thus, example apparatus and methods may account for different types of failures than the conventional complete failure of a disk drive.

Example apparatus and methods combine the speed and flexibility of rateless code approaches (e.g., fountain codes) with the efficiency of rated RS codes to produce a hybrid error correcting code (HECC) that is suitable for a dynamically variable ECC system that selectively determines the amount or type of ECC to produce for a message. The ECC may be produced after a message has been sent, rather than before a message is sent, as is typical in conventional systems that generate and send an entire fixed amount of ECCs. Example apparatus and methods may dynamically determine an appropriate amount or type of ECCs to generate or provide. Additionally, rather than blindly sending, a complete set of ECC to a pre-determined set of receivers, example apparatus and methods may determine, prior to transmission or after message receipt, appropriate numbers of recipients for the ECCs. Determining an appropriate smaller amount of ECCs to produce or generate may save computing resources and transmission resources. Similar bandwidth savings may be achieved when data that has been distributed to a set of receivers is read back. Conventional systems may read back all data and all available ECC.

While ECCs may be produced, example apparatus and methods may, additionally or alternatively, produce HECCs. In one embodiment, an appropriate amount or type of HECCs to generate or provide may be dynamically determined. Additionally, example apparatus and methods may dynamically determine appropriate recipients for the HECCs. Dynamically determining the type and amount of ECC or HECC to produce, and determining where and when to provide the ECC or HECC facilitates reducing the amount of processing time or power needed to encode ECC or HECC. Delaying the decision concerning the amount or type of ECC or HECC to produce also facilitates reducing the bandwidth needed to distribute data, ECC, and HECC, and also facilitates reducing the storage requirements on a receiving data storage device. The decision concerning the number or type of ECCs or HECCs to be produced and the recipients of the ECCs or HECCs may be based, at least in part, on a characteristic (e.g., error state of message, perceived reliability, speed, cost) of the devices that receive the data that is protectable by the ECC or HECC or of devices that only store ECC or HECC associated with protecting a message.

Not all data storage devices are created equal. Similarly, not all data distribution channels are created equal. Additionally, different data communications may have different dependability or costs at different times. Therefore, example apparatus and methods employ different approaches for generating or distributing data, ECC, and HECC. For example, an initial data transfer may involve just plaintext data and a simple cyclic redundancy check (CRC) or other error detection code. If the data is received and stored properly, then there is no immediate need to generate or transmit ECC or HECC associated with reconstructing the data that was not damaged during transit. If the received data has errors, then an appropriate type or amount of ECC or HECC may be generated and provided. Waiting to produce or provide ECC or HECC may save computing resources and data communication resources as compared to conventional systems. In one embodiment, a large set of ECC may be generated but only a smaller subset of the ECC may be provided. Over time, as conditions change, adaptive rules may select a larger subset of the ECC to be provided.

Example apparatus and methods may identify protection policies to be employed based on experience data with a data transmission or a data receiver. The experience data may identify whether a recent data transmission delivered data without errors or may identify the likelihood that a data receiver (e.g., node, data storage device, data store) will be able to store the data without errors. The protection policies may identify, for example, A/B policies that control the number of erasure code symbols generated and the distribution of those symbols. In one embodiment, A and B may be manipulated based on an attribute of a data transmission or receiver. For example, a first data storage device that experiences a first, lower level of errors may be provided with a first, lower amount of ECC or HECC while a second data storage device that experiences a second, higher level of errors may be provided with a second, greater amount of ECC or HECC. In one embodiment, the amount of ECC or HECC may vary with a property or properties of a data storage device. Rather than rely on data reported by a data storage device, example apparatus and methods may maintain their own statistics or data concerning data storage devices and may tailor the ECC or HECC based on that locally stored data. Thus, device reliability may be viewed from the point of view of the ECC or HECC generator, rather than from the point of view of the receiving device. For example, a receiving device may store statistics about its performance. Conventional systems may tailor operations based on the statistics provided by the receiving device. Example apparatus and methods may keep their own data (e.g., statistics) concerning the performance of a receiving device. Decisions concerning ECC or HECC generation or provision may be based on the locally stored data about the receiving device, rather than on the statistics provided by the receiving device itself.

Example apparatus and methods may also select data storage devices to receive data, ECCs, or HECCs based on properties of the data storage devices. When the assumption is made that data will generally not need to be corrected, then data may be stored by itself on the fastest data storage devices available with a minimum amount, if any, of ECCS or HECCs also stored on the fastest data storage devices. The ECCs or HECCs may be stored on slower data storage devices that may rarely, if ever, be accessed. The slower devices may be less expensive than the faster devices that are used for the data.

Selectively computing and selectively providing a variable amount or type of HECC may be simplified by the existence of an optimum rateless code that is computed from data associated with a hybrid RS matrix and that can be adjusted on-the-fly. Example apparatus and methods employ a hybrid rateless RS ECC. The hybrid rateless RS ECC may be generated using a modified RS matrix approach.

Rateless ECs may be well-suited for this application of adaptively varying erasure code protection. When a rateless EC is employed, additional rateless EC symbols may be generated and stored on demand rather than computed as a complete set before message transmission. The additional rateless EC symbols may be generated using the same generator matrix that was used to generate the original rateless erasure codes. The original rateless EC may not need to be deleted or overwritten. While rateless ECs may be generated, in one embodiment, a set of rateless ECs may be generated but only a subset of the set of rateless ECs provided. Adaptive rules may transmit different subsets of different sizes based on conditions. For example, a first A/B policy (e.g., 20/10) may be adapted down to a second lower A/B policy (e.g., 16/10) based on adaptive conditions. In this example, 4 EC are discarded, which effectively generates a rateless RS code.

Prior Art FIG. 10 illustrates an original message 1000 that has sixteen symbols S1, S2, . . . S16 (k=16) and that reads "original message". While the symbol size is one character, different symbol sizes may be employed. Message 1000 is provided to erasure encoder 1010. Erasure encoder 1010 uses a generator matrix 1020 to produce EC symbols 1030. In this example, erasure encoder 1010 produces systematic EC symbols EC1, EC2, . . . ECn (n>k). The systematic EC symbols include EC1 . . . EC16 (EC1 . . . ECk), which correspond directly to S1 . . . S16 (S1 . . . Sk). In this embodiment, at least EC1 . . . EC16 may be the same size as S1 . . . S16. For example, if the symbols S1 . . . S16 are one byte each, then the symbols EC1 . . . EC16 may also be one byte each. The systematic EC symbols also include EC17 . . . ECn (ECk+1 . . . ECn), which do not correspond to any of S1 . . . Sk. In one embodiment, ECk+1 . . . ECn may be parity information. In another embodiment, ECk+1 . . . ECn may be other information that facilitates recreating the original message.

The original message 1000 can be recreated from any 16 of the systematic EC symbols EC1 . . . ECn. If EC1 . . . ECk are available, then original message 1000 can be recreated without performing EC decoding. If any of EC1 . . . ECk are not available, then original message 1000 can still be recreated but EC decoding would be necessary. Systematic ECs do not incur a decode penalty when reading back data that has not encountered any erasures (e.g., no data has been corrupted or lost) since some of the encoded symbols are actually just the plaintext symbols from the original message. When no data has been lost, decoding can be avoided, which improves performance. Rateless ECs handle large data objects well, are flexible for adapting to different levels of protection, and are reliable against random, distributed errors. Thus, example apparatus and methods may employ systematic EC, rateless ECs, or even systematic rateless ECs. Other forms of ECs may also be employed.

Prior Art FIG. 11 illustrates an original message 1100 that also has sixteen symbols S1, S2, . . . S16 (k=16) and that reads "original message". While the symbol size is one character, different (e.g., larger) symbol sizes are likely to be employed. Message 1100 is provided to erasure encoder 1110. Erasure encoder 1110 uses a generator matrix 1120 to produce EC symbols 1130. In this example, erasure encoder 1110 produces non-systematic EC symbols EC1, EC2, . . . ECn (n>k). EC1, EC2, . . . ECn do not correspond directly to any of S1 . . . S16 as was the case for systematic ECs 1030 (FIG. 10). Instead, EC1, EC2, . . . ECn are the result of processing symbols S1 . . . S16 with the matrix 1120 as controlled by erasure encoder 1110.

Figure 2:
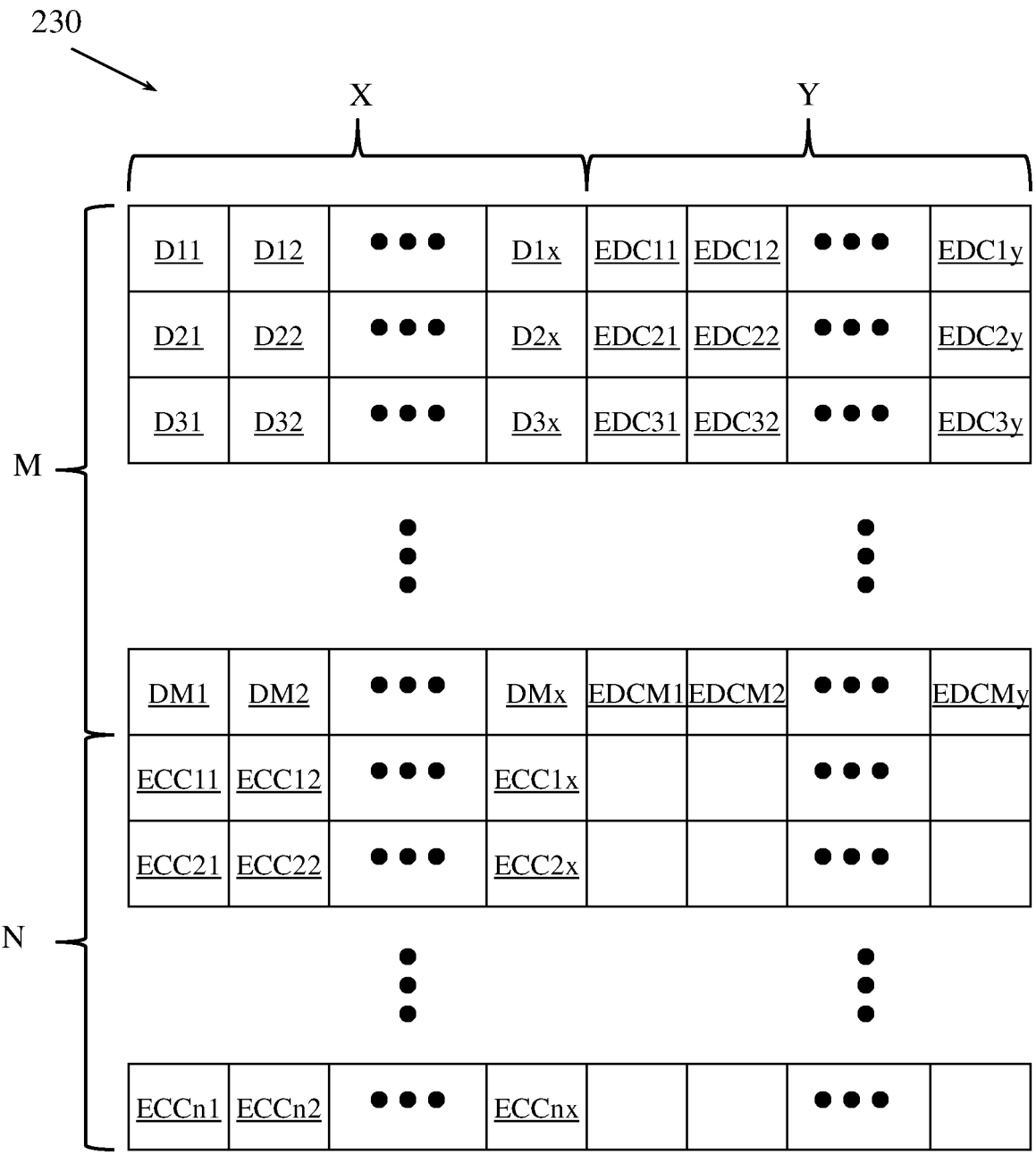
FIG. 2 illustrates a hybrid Reed Solomon (RS) code matrix.

FIG. 2 illustrates a hybrid RS code matrix 230. The matrix 230 is arranged in rows and columns. Rows may store data and error detection codes (EDC). Columns may store data and error correcting codes (ECC). The matrix may have M rows of data and N rows of ECC, M and N being numbers. A row may include X data units and Y error detection codes, X and Y being numbers. In a conventional RS matrix, the number of EDC may be fixed. A column may also include several data units and several error correcting codes. In a conventional RS matrix, the number of ECC may be fixed. In a conventional RS matrix, the EDC and ECC are completely determined when the data is added to the matrix. The matrix then remains as a fixed, determined structure.

Example apparatus and methods are not so limited. Instead, the number of EDC or ECC may vary. Additionally, the time at which the ECC are created may be delayed. Rather than automatically computing the ECC when the data is added to the matrix 230, in one embodiment, ECC may be computed and stored on an as-needed basis. The EDC may be referred to as being "row centric" and the ECC may be referred to as being "column centric." More generally, the EDC may be associated with a first dimension of the data structure and the ECC may be associated with a second dimension of the data structure.

Figure 3:
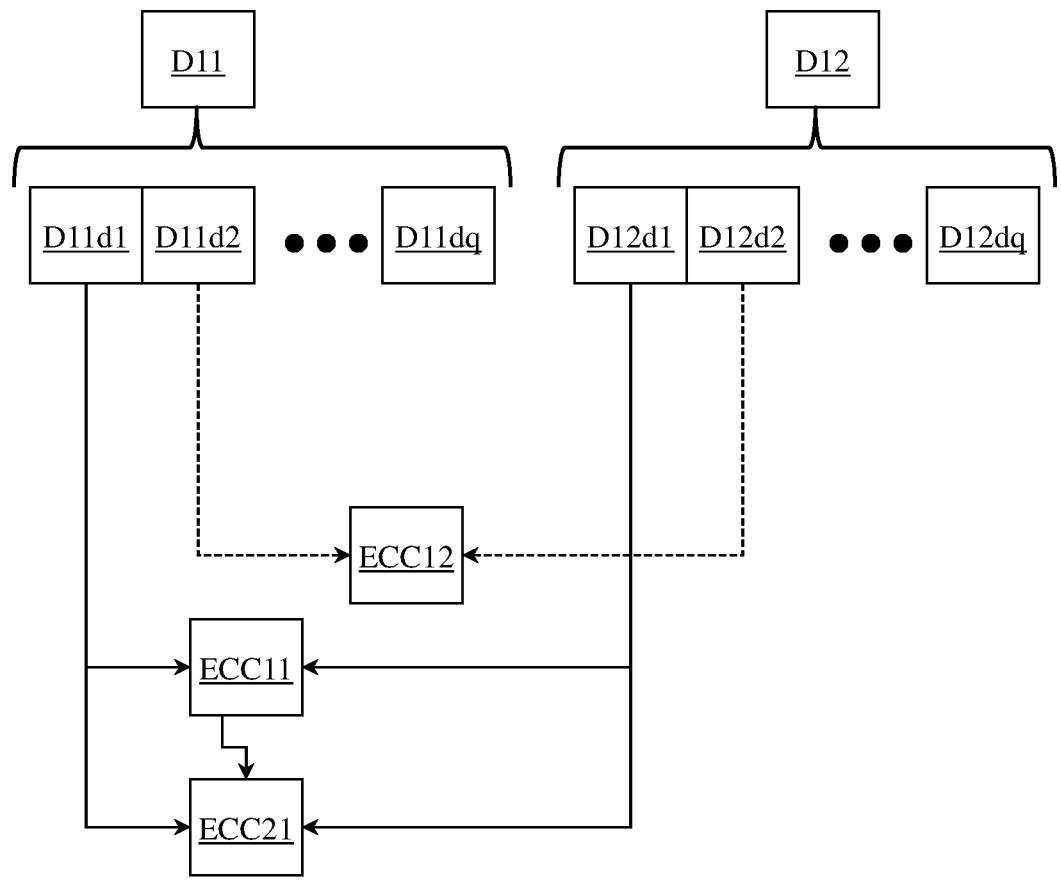
FIG. 3 illustrates data and example ECC produced from the data.

FIG. 3 illustrates data and example ECC produced from the data. A first data unit D11 may include several sub units (e.g., D11$d$1, D11$d$2 ... D11$dq$). Similarly, a second data unit D12 may include several sub units (e.g., D12$d$1, D12$d$2 ... D12$dq$). D11 and D12 may be, for example, consecutive data units in a row in the RS matrix 230 (FIG. 2). Error correcting codes may be produced from the data. For example, ECC11 may be produced from the first sub units of the data units. Similarly, ECC21 may be produced from the first sub units of the data units. Additionally, ECC21 may depend, at least in part, on ECC11. ECC12 may be produced, for example, from the second sub units of the data units.

Figure 4:
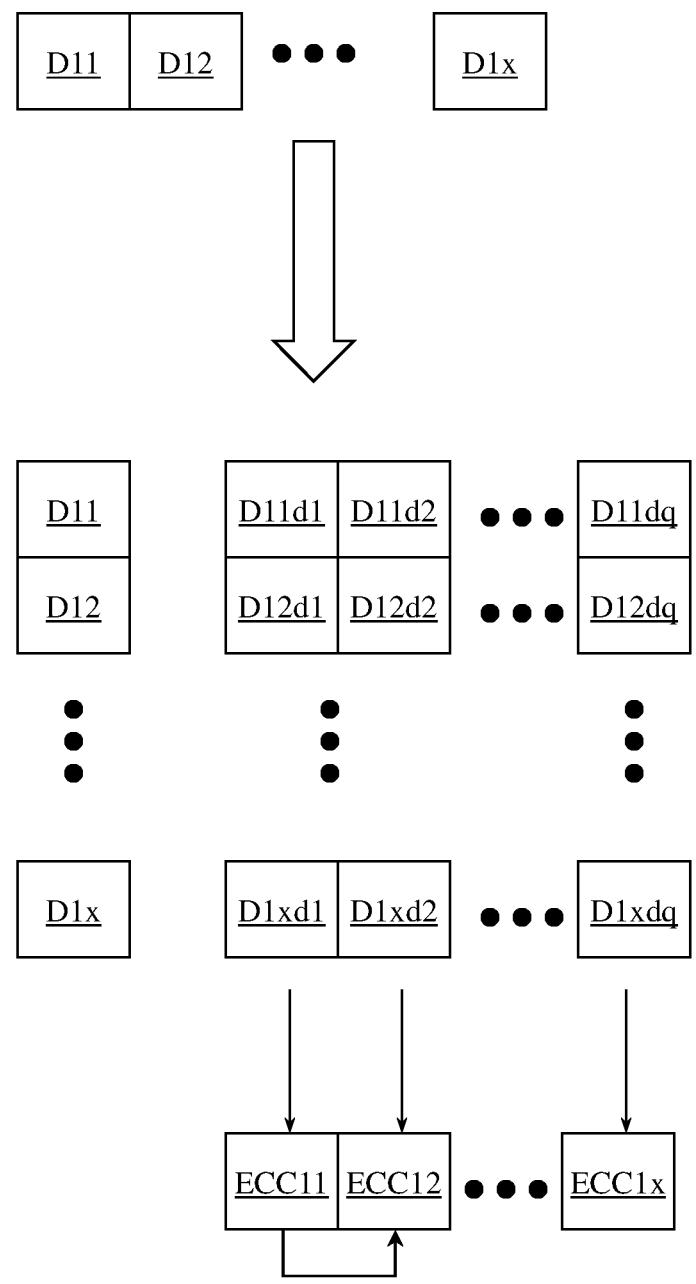
FIG. 4 illustrates data and example ECC produced from the data.

FIG. 4 illustrates data and example ECC produced from the data. Data units D11, D12 ... D1$x$ have been flipped from their first dimension orientation (e.g., row) to a second dimension orientation (e.g., column). The column centric nature of the ECC is more easily visualized when the data units are flipped in this way.

Figure 5:
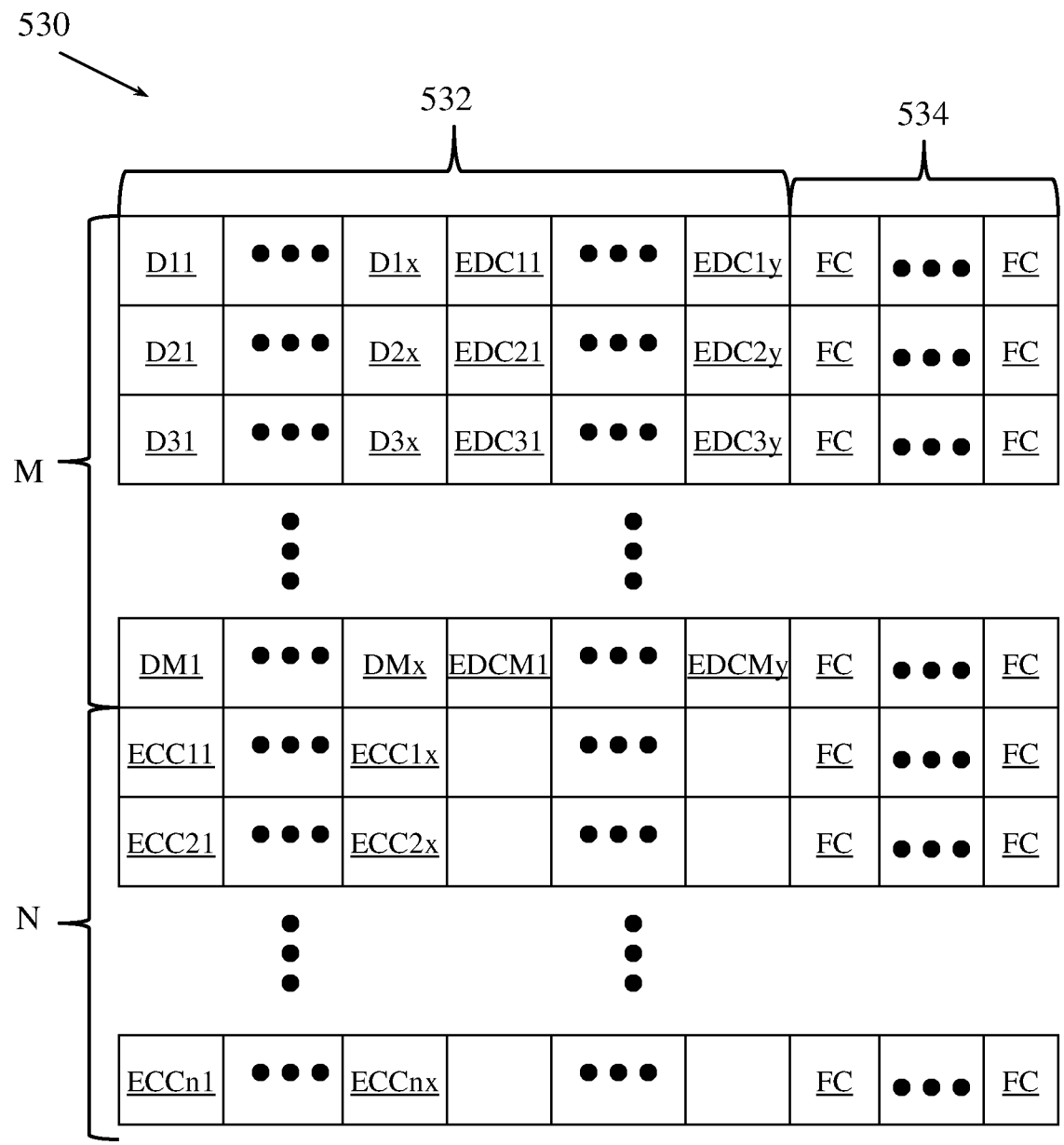
FIG. 5 illustrates a hybrid data structure that stores hybrid RS code data and rateless codes produced from the hybrid RS code data.

FIG. 5 illustrates a hybrid data structure 530 that stores hybrid RS code data 532 and rateless codes 534 (e.g., fountain codes) produced from the hybrid RS code data 532. Conventionally, the amount N of ECC may have been determined by the amount M of data. The hybrid RS code data 532 may include data, error detection codes, and error correcting codes. The rateless codes 534 may include, for example, fountain codes that are computed from different combinations of the data, error detection codes, or error correcting codes. Unlike a conventional ECC matrix, the ECC or the fountain codes may be computed at times other than when the data is added to the matrix. For example, ECC or fountain codes may be computed upon determining that there is data that needs to be corrected.

In one embodiment, the hybrid data structure 530 could be used by a computerized method that selects how many, if any, hybrid rateless RS ECC to produce for a message and that also controls when the hybrid rateless RS ECCs are produced. Thus, the amount N of ECC may not be predetermined and may not be fixed. The hybrid rateless RS ECCs may be produced for a message that is stored in a modified RS Solomon generator matrix. The hybrid rateless RS ECC are produced using the modified RS generator matrix. Unlike conventional systems that automatically produce a full complement of RS codes, the hybrid data structure may be used by a method that controls the time at which the computer produces the hybrid rateless RS error correcting codes. The time may be after a message has been transmitted, after a message has been stored by a recipient, after an error has been detected in a message, or other times. Even though the time when the hybrid rateless RS error correcting codes may be produced can be delayed, in one embodiment, a set of ECC may be produced and then the time at which and the size of a subset of the ECC that are provided may be controlled.

In one embodiment, the control is based, at least in part, on the correctness of the message as stored in an electronic data store. For example, if the message was stored with no errors, then no ECC may be produced or transmitted, but if the message was stored and experienced a correctable number of errors, then an appropriate amount of ECC may be produced or transmitted. Rather then automatically producing and transmitting a full complement of ECC, only a desired or necessary amount of ECC may be produced or transmitted. In one embodiment, the control may be based, at least in part, on the likelihood of an error affecting the message as stored in an electronic data store. The likelihood may be tracked by the method from generator-side data. Conventional systems may rely on data provided by the electronic data store, which data may be inappropriate or self-serving.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 6:
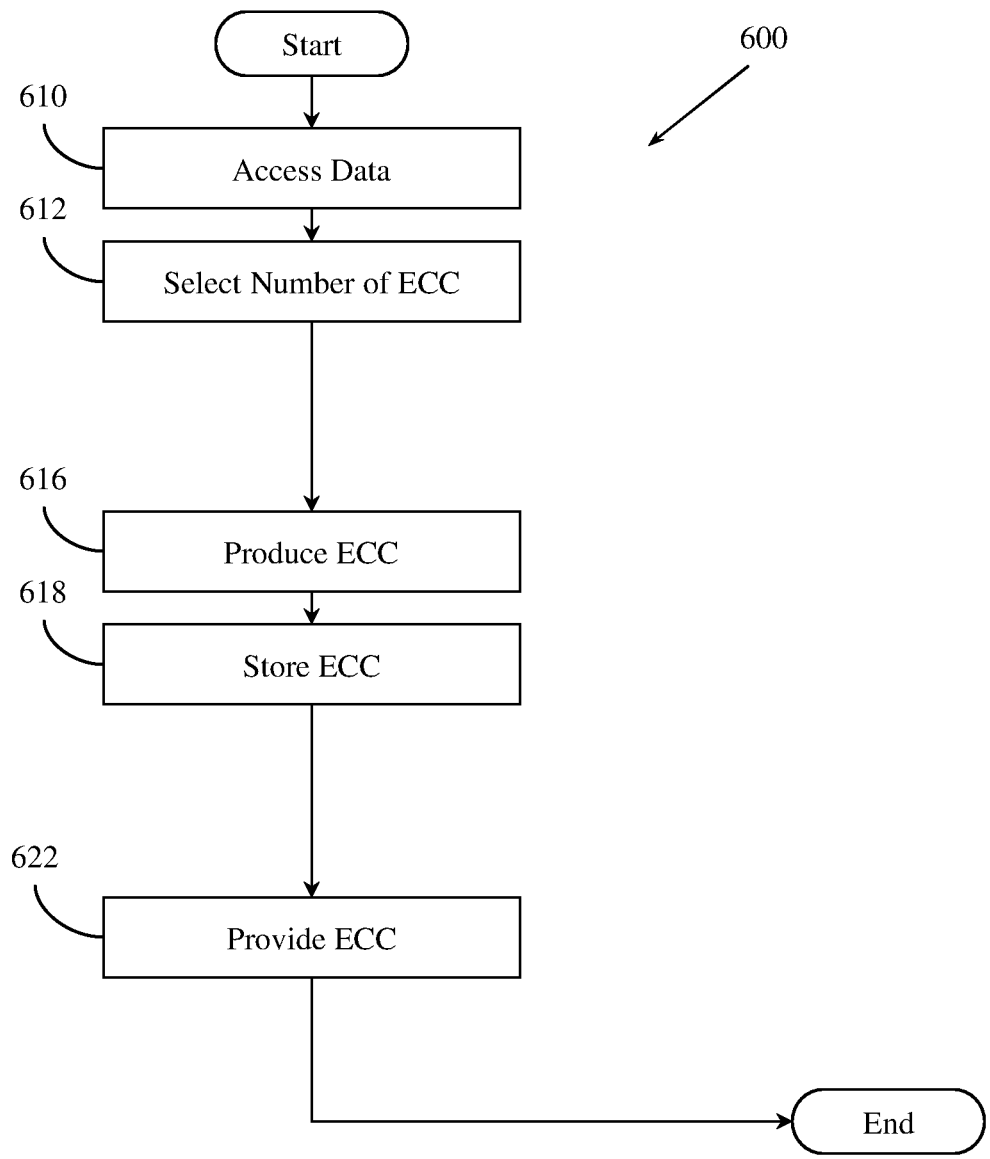
FIG. 6 illustrates an example method associated with a dynamically variable ECC system that uses hybrid rateless Reed-Solomon ECCs.

FIG. 6 illustrates a method 600 associated with a dynamically variable ECC system that uses hybrid rateless RS ECCs. Method 600 may include, at 610, accessing first electronic data that describes a data storage device to which a message has been provided. Unlike conventional systems, the first electronic data may not be provided by the data storage device but rather may be produced or stored by the method. Thus, the reliability of a device may be considered from the point of view of the message generator rather than the device itself. In one embodiment, the first electronic data describes whether the message provided to the data storage device was stored error free by the data storage device.

The message may have been provided to the data storage device from a hybrid RS data structure. In one embodiment, the hybrid RS data structure may share some attributes with the generator matrix described in U.S. Pat. No. 7,076,723, by the same inventor, which is incorporated herein by reference. The hybrid RS data structure is stored in an electronic data store. The hybrid RS data structure includes plaintext data arranged in two or more dimensions (e.g., rows and columns) and a set of error detection codes associated with a first dimension (e.g., rows) of the plaintext data. Unlike conventional systems, the EDCs may be more complex than simple CRCs.

Method 600 may also include, at 612, selecting a number of ECC to produce, for the message. The number of ECCs to produce, may be based, at least in part, on the first electronic data. In one embodiment, the number of ECC varies inversely with the reliability of the data storage device. For example, as a data storage device is perceived to be less reliable, more ECC may be generated and provided to the data storage device or to other devices co-operating with the data storage device to store and protect a message on the assumption that more ECC is likely going to be needed to correct more frequent data errors. For a data storage device that is deemed very reliable (e.g., not likely to have data errors), a minimal amount of ECC may be produced and distributed. In one embodiment, a large or complete set of ECC may be produced regardless of the first electronic data.

Method 600 may also include, at 616, producing the ECC for the message from data stored in the hybrid RS data structure. The number of ECCs produced may be the number selected at 612. The ECCs may be produced using different algorithms or techniques. By way of illustration, the first dimension may be orthogonal to the second dimension and a member of the set of ECC may be a product of a selected portion of the plaintext data in the dimension orthogonal to the ECC dimension. In another embodiment, the first dimension may be orthogonal to the second dimension and a member of the set of ECC may be a product of a selected portion of the plaintext data in the dimension parallel to the ECC dimension. In one embodiment, an $i^{th}$ member of the set of ECC can be constructed as a function of an $i^{th}-1$ member of the set of ECC, i being an integer.

Method 600 may also include, at 618, storing the ECC produced at 616 in the hybrid RS data structure. The ECC may be stored as part of a set of ECC associated with a second, different dimension of the plaintext data. For example, the ECCs may be stored in columns in the data structure.

Method 600 may also include, at 622, selectively providing an ECC to an ECC receiver. The number of ECCs to provide or the number of ECC receivers may be determined based on properties of the message or on properties of the ECC receivers. For example, a message that has been stored with more errors may cause more ECCs to be generated and provided to additional ECC receivers. In another example, where a large set (e.g., 32) of ECC were produced regardless of the properties of the message or the properties of the ECC receiver, the number of that set that is distributed may be controlled by adaptive rules. Thus, at one time a first amount (e.g., 4) of ECC may be provided from the large set while at a second time a second different amount (e.g., 6) of ECC may be provided.

Figure 7:
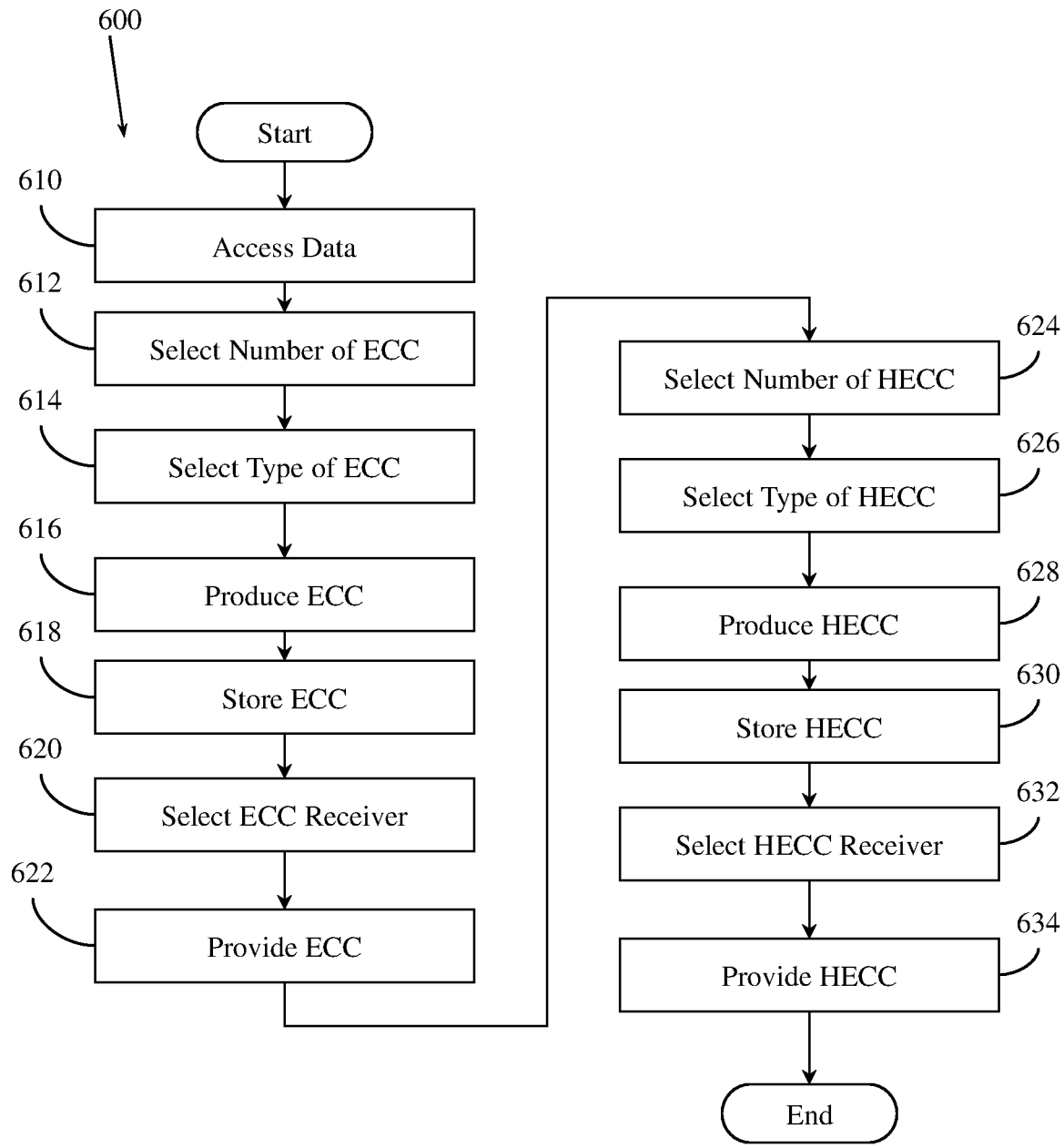
FIG. 7 illustrates an example method associated with a dynamically variable ECC system that uses hybrid rateless Reed-Solomon ECCs.

FIG. 7 illustrates another embodiment of method 600. This embodiment includes actions 610, 612, 616, 618, and 622 described in connection with FIG. 6. This embodiment also includes additional actions.

For example, this embodiment also includes, at 614, selecting a type of ECC to produce. The type of ECC to produce may be based, at least in part, on the first electronic data. In one embodiment, the type of ECC is described by an A/B policy, where B describes the total number of ECC symbols that can be produced for the message and A describes the minimum number of the B ECC symbols that are required to recreate the message for which the ECC symbols were produced. Unlike conventional systems, neither A nor B may be determined ahead of time. Instead, method 600 may determine A or B based on information about a data communication, based on information about a stored message, based on information about a recipient of a message, or based on other information. In one embodiment, when the amount and type of ECC exceeds a threshold, then only ECC (e.g., no plaintext data) may be provided from the hybrid RS data structure. In this way, a de facto "encrypted" RS code may be produced without performing encryption.

This embodiment of method 600 may also include, at 620, selecting an ECC receiver. The ECC receiver may be selected based, at least in part, on a property of the ECC receiver. The property may be, for example, the speed of the ECC receiver, the reliability the ECC receiver, the cost to store data on the ECC receiver, or other data. In one embodiment, the ECC receiver may be the same device that received the message (e.g., the data storage device). In one embodiment, the ECC may be one or more devices other than the device that received the message.

This embodiment of method 600 may also include, at 624, selecting a number of hybrid error correcting codes (HECC) to produce. How many HECC to produce, if any, may be based, at least in part, on the first electronic data. For example, if the first electronic data indicates that the message was transmitted, received, and stored without errors, then no or minimal HECCs may be produced. But if the first electronic data indicates that the message has errors or is likely to experience errors, then additional HECCs may be produced. In one embodiment, the number of HECCs may vary inversely with the reliability of the data storage device from the point of view of the method. In one embodiment, a large (e.g., 32) set of HECC may be produced regardless of the first electronic data.

This embodiment of method 600 may also include, at 626, selecting a type of HECC to produce based, at least in part, on the first electronic data. The different types of HECC may include rateless ECs including fountain codes, LT codes, Raptor codes, online codes, or other codes. In one embodiment, the HECC is a 100% efficient fountain code. In one embodiment, the type of HECC controls whether the HECC is produced from plaintext in the hybrid RS data structure, from an error detection code (EDC) in the hybrid RS data structure, from an error correction code (ECC) in the hybrid RS data structure, or from various combinations of plaintext (e.g., data), EDC, and ECC.

In one embodiment, the type of HECC may be described by a C/D policy, where D describes the total number of HECC symbols that can be produced for the message and C describes the minimum number of the D HECC symbols that are required to recreate the message for which the HECC symbols were produced. Unlike conventional systems, C and D may be determined on-the-fly in response to actual conditions. C and D are numbers.

This embodiment of method 600 may also include, at 628, selectively producing the number of HECCS from data stored in the hybrid RS data structure. This embodiment of method 600 may also include, at 630, storing the HECCs in the hybrid RS data structure. Storing the HECCs may include providing an HECC to a memory, placing an HECC in a register for delivery to a memory, providing an HECC as an argument in a procedure call, or other computerized action.

This embodiment of method 600 may also include, at 632, selecting a HECC receiver to receive members of the HECCs. The HECC receivers may be selected based, at least in part, on a property of the HECC receiver. The property may be, for example, the speed of a receiver, the reliability of the receiver, a current error condition (e.g., number of bit errors) for a message stored at the receiver, a cost to store data on the receiver, or other property. The receiver may be the data storage device to which the message was provided or other devices that are participating in storing and protecting the message.

This embodiment of method 600 may also include, at 634, selectively providing one or more of the number of HECCs to one or more HECC receivers. Unlike conventional systems, the HECC may be provided later, in some cases much later, than a message that is protected by the HECC is provided. For example, the message may be delivered on a first day and may have been received and stored without error. The message may reside at the recipient for days, weeks, or even years before an error is encountered. In one embodiment, the HECC may be generated and provided upon determining that an error was encountered. This approach saves processing time at the outset when the message is provided, saves bandwidth at the outset when the message is provided, and saves storage space. The computational power, time, bandwidth, and storage space may not be consumed until an error is encountered. In one embodiment, the HECC may be generated when the data is provided but only a selected amount of HECC may be distributed at a later time, with the amount of HECC determined by adaptive rules that consider existing conditions.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a discrete logic (e.g., ASIC), an analog circuit, a digital circuit, a programmed logic device, or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Object", as used herein, refers to the usage of object in computer science. From one point of view, an object may be considered to be a location in a physical memory having a value and referenced by an identifier.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

Figure 8:
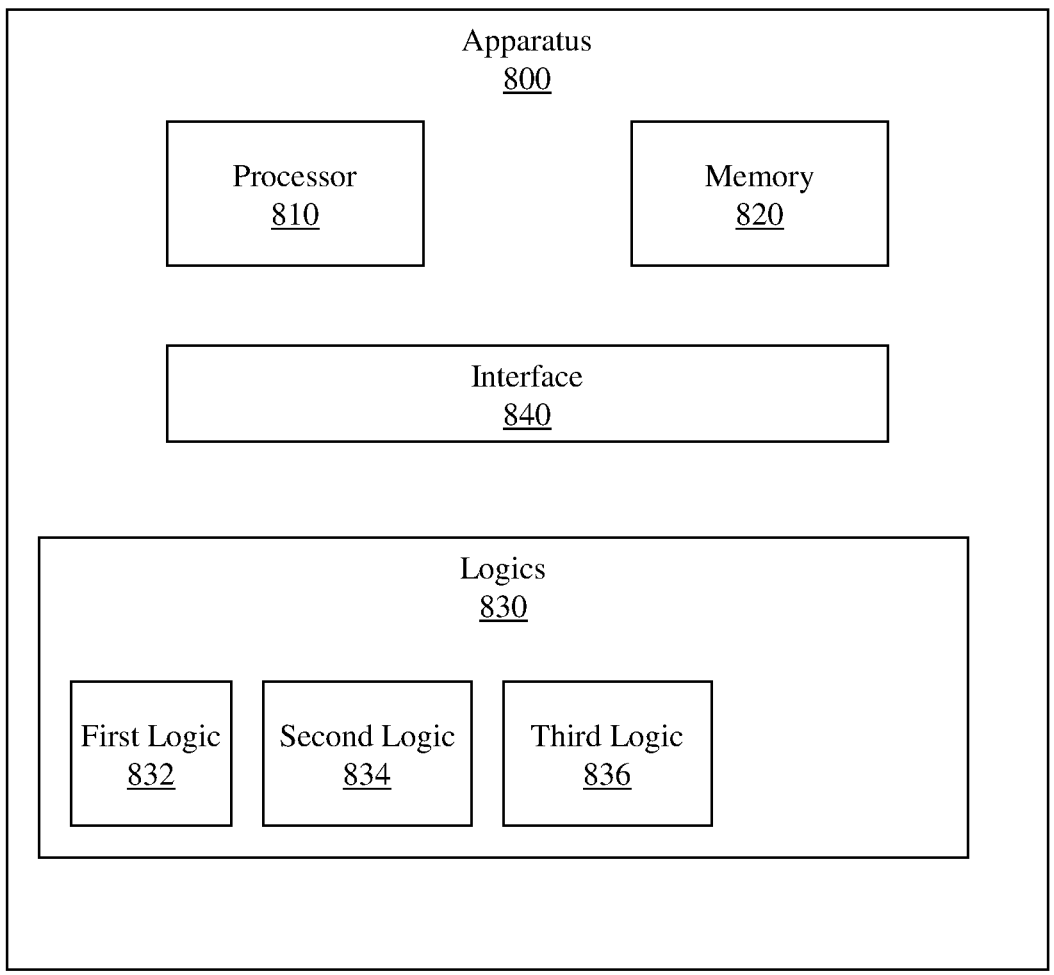
FIG. 8 illustrates an example apparatus associated with a dynamically variable ECC system that uses hybrid rateless Reed-Solomon ECCs.

FIG. 8 illustrates an apparatus 800 that includes a processor 810, a memory 820, and a set 830 of logics that is connected to the processor 810 and memory 820 by an interface 840. In one embodiment, the apparatus 800 may be a stand-alone device connected to a data communication network. In another embodiment, apparatus 800 may be integrated into another device (e.g., deduplication apparatus) or system (e.g., object storage system). Apparatus 800 may be associated with a dynamically variable ECC system that uses hybrid rateless RS ECCs. By making the ECC system dynamically variable, processor 810 may run more efficiently because less ECC may be need to be created or distributed. Similarly, less memory 820 may be consumed because less ECC is produced. Thus, the dynamically variable ECC system provides one approach for producing the concrete, tangible, real-world, non-abstract result of improving efficiency in an apparatus 800 that produces ECC for messages.

Memory 820 stores a modified RS matrix having row-centric error detection codes and column-centric error correcting codes. The modified RS matrix may take a form similar to that described in U.S. Pat. No. 7,076,723 by the same inventor, which is incorporated herein by reference.

The set 830 of logics may include a first logic 832 that identifies a non-empty set of RS error correction codes to produce for a message that has already been provided to a recipient. The message that apparatus 800 provided is stored in the modified RS matrix in memory 820 and thus there may be error detection codes available for rows of plaintext in the modified RS matrix. The RS ECC may be added to columns in the modified RS matrix. The size of the non-empty set may be determined by, for example, how many errors, if any, appear in the message after it is provided to the recipient. In one embodiment, the size of the non-empty set may be larger than necessary to facilitate rapid response to changing conditions where additional RS ECC may be distributed on an as-needed basis.

The apparatus 800 may also include a second logic 834 that produces the set of RS ECC from data in the modified RS matrix. Unlike conventional systems, the second logic 834 may produce the set of RS ECC after the message has been provided to the recipient. The number of ECC codes produced may depend on how the message was received and stored. For example, if the message was received and stored without errors, then a minimal amount of ECC, if any, may be produced or provided. However, if the message was received in error or stored in error, then an appropriate amount of ECC may be produced or provided. For example, if it is determined that the message was stored with two errors, then only the ECC needed to correct for two errors may be produced or provided. This may be less than the conventional full complement of ECC and thus may save processing power, time, communication bandwidth, and storage space as compared to conventional systems. In one embodiment, the full complement of ECC may have been produced and an appropriate amount of ECC may be distributed as needed.

The apparatus 800 may also include a third logic 836 that selectively distributes a member of the set of RS ECC to a data store involved in storing the message for the recipient. Unlike conventional systems that distribute ECC contemporaneously with the message, the third logic 836 may distribute the member after the message has been provided to the recipient.

In one embodiment, the size of the set of RS ECC is based, at least in part, on a property of the data store. For example, the number of errors detected in the message as stored in the data store at the recipient may control the size of the set of RS ECC. In other embodiments, the reliability, speed, cost, or other attribute of the data store at the recipient may determine the size of the set of RS ECCs. In one embodiment, the size of the set of RS ECCs may not depend on a property of the data store. In this embodiment, the number of RS ECCs that are provided from the set of RS ECCs may depend on the property of the data store or other factors.

Figure 9:
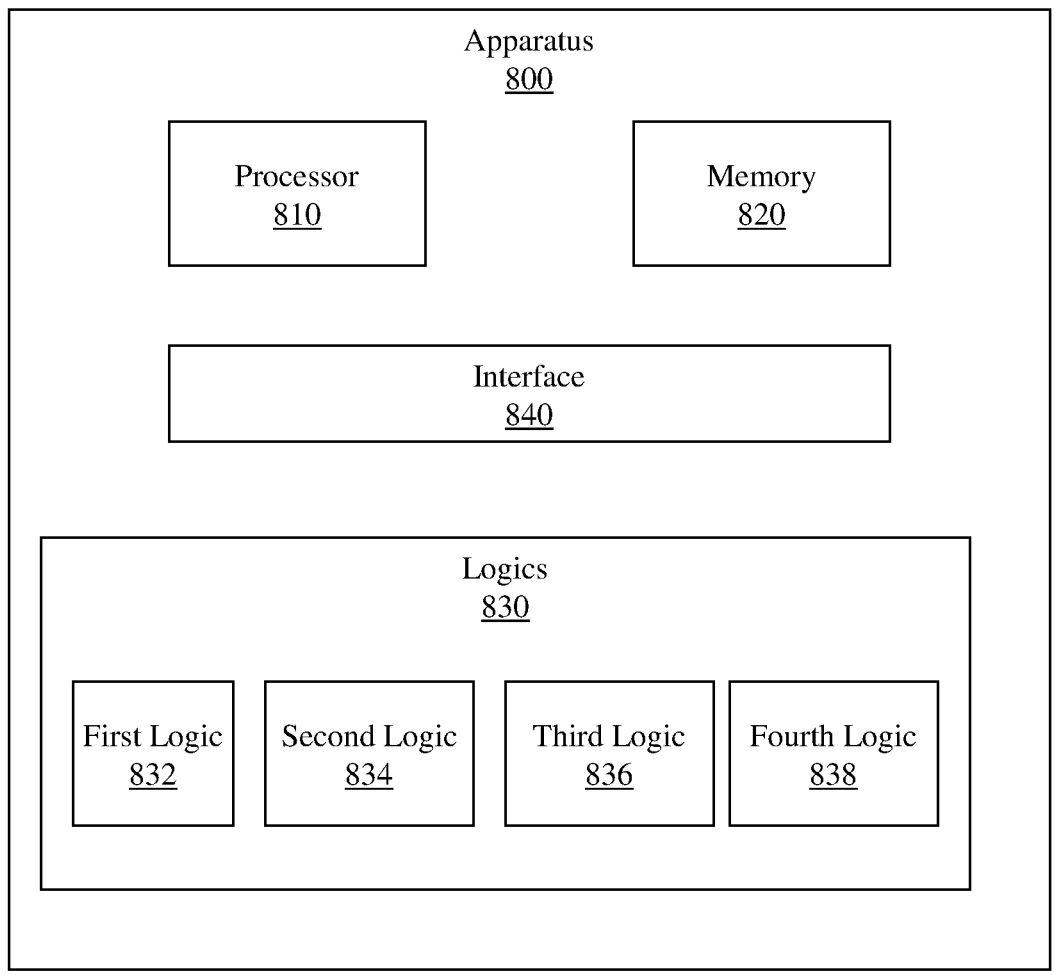
FIG. 9 illustrates an example apparatus associated with a dynamically variable ECC system that uses hybrid rateless Reed-Solomon ECCs.

FIG. 9 illustrates another embodiment of apparatus 800. This embodiment includes a fourth logic 838. The fourth logic 838 may identify a non-empty set of fountain codes to produce for the message. The size of the non-empty set may be determined by, for example, the reliability of a receiving device, the cost to store data on the receiving device, how many errors, if any, are reported for a message provided to the receiving device, or on other attributes. In one embodiment, the size of the non-empty set of fountain codes may not depend on an external property but may be pre-determined. In this embodiment, the number of fountain codes that are distributed from the non-empty set may depend on the reliability of a receiving device, the cost to store data on the receiving device, how many errors, if any, are reported for a message provided to the receiving device, or on other attributes.

The fourth logic 838 may produce the set of fountain codes for the message using data in the modified RS matrix. In different embodiments, the fourth logic 838 may use just plaintext, may use plaintext and EDC, may use plaintext and ECC, or may use other combinations of data, EDC, or ECC.

The fourth logic 838 may also selectively distribute a member of the set of fountain codes to a data store involved in storing the message for the recipient. In one embodiment, the size of the set of fountain codes is based, at least in part, on a property of the data store. For example, the number of fountain codes that are produced or distributed may be a function of the reliability, speed, cost, or other attribute of a recipient.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A method comprising the steps of:
accessing first electronic data that indicates a reliability of a data storage device to which a first message has been provided, where the first electronic data is not provided by the data storage device, the first message being provided from a hybrid Reed Solomon data structure stored in an electronic data storage;
producing a number of error correcting codes for the first message from data stored in the hybrid Reed Solomon data structure;
storing the number of error correcting codes in the hybrid Reed Solomon data structure as part of a first set of error correcting codes associated with a first dimension of plaintext data, and
selectively providing the number of error correcting codes to one or more error correcting code receivers.

2. The method of claim 1 wherein the hybrid Reed Solomon data structure includes the plaintext data arranged in two or more dimensions and a second set of error detection codes associated with a second, different dimension of the plaintext data.

3. The method of claim 2 wherein the first dimension is orthogonal to the second dimension, and where a member of the sets of error correcting codes is a product of a selected portion of the plaintext data in the dimension orthogonal to the error correcting code dimension.

4. The method of claim 1 further comprising the step of maintaining second electronic data comprising experience data that identifies a level of errors resulting from transmitting and storing a recent data transmission to a cloud storage, where a second message is provided to the cloud storage from a hybrid Reed Solomon data structure stored in the electronic data storage.

5. The method of claim 4 further comprising the step of selecting a second number of error correcting codes to produce for the second message based, at least in part, on the experience data.

6. The method of claim 4 wherein a reliability of the cloud storage is indicated by the level of errors.

7. The method of claim 6 wherein the number of error correcting codes varies inversely with the reliability of the cloud storage.

8. The method of claim 4 further comprising the step of selecting a type of error correcting code to produce based, at least in part, on the level of errors.

9. The method of claim 8 wherein the type of error correcting code is described by an A/B policy, where B describes the total number of error correcting code symbols that can be produced for the message and A describes the minimum number of the B error correcting code symbols that are required to recreate the second message for which the error correcting code symbols were produced, A and B being numbers.

10. The method of claim 4 further comprising the step of selecting a number of hybrid error correcting codes to produce based, at least in part, on the level of errors.

11. The method of claim 10 wherein the number of hybrid error correcting codes varies in direct relationship with the level of errors from a point of view of the method.

12. The method of claim 1 wherein an $i^{th}$ member of the first set of error correcting codes can be constructed as a function of an $i^{th}-1$ member of the first set of error correcting codes, i being an integer.

13. A method comprising the steps of:
maintaining first electronic data comprising experience data that identifies a level of errors resulting from transmitting and storing a recent data transmission to a cloud storage, where a message is provided to the cloud storage from a hybrid Reed Solomon data structure stored in an electronic data storage;
producing a number of error correcting codes for the message from data stored in the hybrid Reed Solomon data structure;
storing the number of error correcting codes in the hybrid Reed Solomon data structure as part of a set of error correcting codes associated with a second, different dimension of the plaintext data; and
selectively providing the number of error correcting codes to one or more error correcting code receivers.

14. The method of claim 13 further comprising the step of selecting a number of hybrid error correcting codes to produce based, at least in part, on the level of errors.

15. The method of claim 14 wherein the number of hybrid error correcting codes varies in direct relationship with the level of errors from a point of view of the method.

16. The method of claim 14 further comprising the steps of:
selectively producing the number of hybrid error correcting codes from data stored in the hybrid Reed Solomon data structure; and
selectively providing the number of hybrid error correcting codes to one or more HECC receivers.

17. The method of claim 16 further comprising the step of selecting a type of hybrid error correcting code to produce based, at least in part, on a reliability of the cloud storage.

18. The method of claim 17 wherein the type of hybrid error correcting code controls whether the hybrid error correcting code is produced from one of plaintext in the hybrid Reed Solomon data structure and an error detection code in the hybrid Reed Solomon data structure and an error correction code in the hybrid Reed Solomon data structure.

19. The method of claim 17 wherein the type of hybrid error correcting code is described by a C/D policy, where D describes the total number of hybrid error correcting code symbols that can be produced for the message and C describes the minimum number of the D hybrid error correcting code symbols that are required to recreate the message for which the hybrid error correcting code symbols were produced, C and D being numbers.

20. A system, comprising:
a processor;
a memory that stores a modified Reed Solomon matrix having row-centric error detection codes and column-centric error correcting codes;
a set of logics; and
an interface that connects the processor, the memory, and the set of logics;
wherein the set of logics (i) maintains first electronic data comprising experience data that identifies a level of errors resulting from transmitting and storing a recent data transmission to a cloud storage, where a message is provided to the cloud storage from a hybrid Reed Solomon data structure stored in an electronic data storage, (ii) produces a number of error correcting codes for the message from data stored in the hybrid Reed Solomon data structure, (iii) stores the number of error correcting codes in the hybrid Reed Solomon data structure as part of a set of error correcting codes associated with a dimension of the plaintext data, and (iv) selectively provides the number of error correcting codes to one or more error correcting code receivers.

* * * * *